United States Patent
Verma

(10) Patent No.: US 12,210,754 B2
(45) Date of Patent: Jan. 28, 2025

(54) MODULAR MEMORY ARCHITECTURE WITH MORE SIGNIFICANT BIT SUB-ARRAY WORD LINE ACTIVATION IN SINGLE-CYCLE READ-MODIFY-WRITE OPERATION DEPENDENT ON LESS SIGNIFICANT BIT SUB-ARRAY DATA CONTENT

(71) Applicant: STMicroelectronics International N.V., Geneva (CH)

(72) Inventor: Praveen Kumar Verma, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 285 days.

(21) Appl. No.: 17/965,243

(22) Filed: Oct. 13, 2022

(65) Prior Publication Data

US 2023/0135708 A1    May 4, 2023

Related U.S. Application Data

(60) Provisional application No. 63/272,768, filed on Oct. 28, 2021.

(51) Int. Cl.
*G11C 7/10* (2006.01)
*G06F 3/06* (2006.01)
(Continued)

(52) U.S. Cl.
CPC .......... *G06F 3/0625* (2013.01); *G06F 3/0629* (2013.01); *G06F 3/0673* (2013.01);
(Continued)

(58) Field of Classification Search
CPC .................................................... G11C 7/1006
See application file for complete search history.

(56) References Cited

U.S. PATENT DOCUMENTS 5,119,340 A * 6/1992 Slemmer .................. G11C 8/12
365/230.03
5,367,653 A    11/1994 Coyle et al.
(Continued)

OTHER PUBLICATIONS

Selvan, Vinoth: "Adaptive Cache Power Management Strategies", a Thesis Submitted to the Faculty of the Graduate School of the University of Minnesota, Jun. 2016, 51 pages.

*Primary Examiner* — Douglas King
(74) *Attorney, Agent, or Firm* — Crowe & Dunlevy LLC

(57) ABSTRACT

A memory circuit includes an array of memory cells arranged with first word lines connected to a first sub-array storing less significant bits of data and second word lines connected to a second sub-array storing more significant bits of data. A first word line signal is applied to a selected one of the first word lines to read less significant bits from the first sub-array, and a mathematical operation is performed on the read less significant bits to produce modified less significant bits that are written back to the first sub-array. If the read less significant bits are saturated, a second word line signal is applied to a selected one of the second word lines to read more significant bits from the second sub-array, and a mathematical operation is performed on the read more significant bits to produce modified more significant bits that are written back to the second sub-array.

21 Claims, 8 Drawing Sheets

(51) Int. Cl.
*G11C 11/418* (2006.01)
*G11C 11/419* (2006.01)

(52) U.S. Cl.
CPC .......... *G11C 7/1006* (2013.01); *G11C 11/418* (2013.01); *G11C 11/419* (2013.01)

(56) References Cited

U.S. PATENT DOCUMENTS

| | | | |
|---|---|---|---|
| 5,752,260 | A | 5/1998 | Liu |
| 6,112,295 | A | 8/2000 | Bhamidipati et al. |
| 6,608,772 | B2 | 8/2003 | Ooishi |
| 6,707,752 | B2 | 3/2004 | Zhang |
| 6,751,143 | B2 | 6/2004 | Morgan et al. |
| 6,751,159 | B2 | 6/2004 | Farrell et al. |
| 7,038,949 | B2 | 5/2006 | Chae et al. |
| 7,088,638 | B1 | 8/2006 | Bunce et al. |
| 7,251,186 | B1 | 7/2007 | Kengeri et al. |
| 7,339,850 | B2 | 3/2008 | Morishima |
| 7,420,867 | B2 | 9/2008 | Brox |
| 7,469,369 | B2 | 12/2008 | Matsuoka et al. |
| 7,684,257 | B1 | 3/2010 | Lee et al. |
| 7,848,129 | B1 | 12/2010 | Deshpande et al. |
| 8,000,156 | B2 | 8/2011 | Van Winkelhoff et al. |
| 8,850,137 | B2 | 9/2014 | Nazar et al. |
| 8,902,672 | B2 | 12/2014 | Iyer et al. |
| 9,361,955 | B2 | 6/2016 | Muralimanohar et al. |
| 9,411,391 | B2 | 8/2016 | Bhatia et al. |
| 9,460,016 | B2 | 10/2016 | Redford et al. |
| 9,971,541 | B2 | 5/2018 | Lea et al. |
| 10,048,888 | B2 | 8/2018 | Willcock et al. |
| 10,268,389 | B2 | 4/2019 | Lea |
| 10,402,110 | B2 | 9/2019 | Ware et al. |
| 10,460,781 | B2 | 10/2019 | Berger et al. |
| 10,522,210 | B2 | 12/2019 | Hush et al. |
| 10,740,188 | B2 | 8/2020 | Park |
| 10,867,681 | B2 | 12/2020 | Clinton et al. |
| 10,991,423 | B2 | 4/2021 | Singh et al. |
| 11,705,176 | B2 | 7/2023 | Endoh et al. |
| 2001/0024382 | A1 | 9/2001 | Shimoyama et al. |
| 2008/0183984 | A1 | 7/2008 | Beucler et al. |
| 2012/0271990 | A1* | 10/2012 | Chen .................. G11C 29/52 711/E12.008 |
| 2013/0308364 | A1 | 11/2013 | Smith |
| 2015/0109865 | A1 | 4/2015 | Gulati et al. |
| 2015/0310311 | A1* | 10/2015 | Shi .................. H04N 25/78 382/158 |
| 2016/0329088 | A1 | 11/2016 | You |
| 2018/0046436 | A1 | 2/2018 | Lu |
| 2020/0143901 | A1 | 5/2020 | Chhabra et al. |
| 2020/0258890 | A1 | 8/2020 | Augustine et al. |
| 2021/0117156 | A1 | 4/2021 | Ali et al. |
| 2021/0142863 | A1 | 5/2021 | Nazar et al. |
| 2021/0391001 | A1 | 12/2021 | Park et al. |
| 2023/0050783 | A1 | 2/2023 | Verma et al. |
| 2023/0051672 | A1 | 2/2023 | Rawat et al. |
| 2023/0135708 | A1 | 5/2023 | Verma |
| 2023/0393766 | A1 | 12/2023 | Bedeschi |

\* cited by examiner

MODULAR MEMORY ARCHITECTURE WITH MORE SIGNIFICANT BIT SUB-ARRAY WORD LINE ACTIVATION IN SINGLE-CYCLE READ-MODIFY-WRITE OPERATION DEPENDENT ON LESS SIGNIFICANT BIT SUB-ARRAY DATA CONTENT

CROSS REFERENCE TO RELATED APPLICATIONS

This application claims priority from United States Provisional application for Patent No. 63/272,768, filed Oct. 28, 2021, the disclosure of which is incorporated by reference.

TECHNICAL FIELD

The present invention generally relates to a static random access memory (SRAM) circuit and, in particular, to a modular memory architecture for the SRAM circuit where word line activation for a more significant sub-array of the memory is dependent on data content in a less significant sub-array during a single-cycle read-modify-write operation.

BACKGROUND

Reference is made to FIG. 1 which shows a block diagram of a static random access memory (SRAM) 10. The memory 10 includes a memory core 12 formed by a plurality of SRAM cells (C) (for example, of the 6T or 8T type as is well known in the art). The cells C are arranged in an array including j rows and k columns. The cells C in each row of the memory core 12 are coupled to a corresponding word line (WL), and the cells in each column are coupled to at least one corresponding bit line (BL). In an implementation using the 6T type SRAM circuit, a pair of complementary bit lines is present and is used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell.

The memory 10 further includes a row decoder circuit 14 that is configured to receive a memory address (Address). The row decoder circuit 14 decodes the m bits of the received memory address and selectively actuates one word line (WL) which corresponds to a data word location (dw loc) in the memory core 12 associated with the decoded memory address where bits of a data word (for example, a count value) is stored. Details of the circuitry for the row decoder circuit 14 are not provided as such circuitry is well known to those skilled in the art.

Data input/output (I/O) circuitry 16 for the memory 10 includes an I/O circuit 18 for each column of the memory core 12. Each I/O circuit 18 includes a precharge circuit PCH and a sense amplifier circuit SA connected to the bitline BL of the corresponding column. The precharge circuits PCH are used to precharge the bit lines BL to a certain voltage level (for example, Vdd) prior to a read or write operation. The sense amplifier circuit SA functions, when actuated by assertion of a sense amplifier enable (SAEN) signal during the read operation, to drive an amplifier output signal to a supply rail (Vdd or ground, for example) as a function of the logic state of the data bit stored in the memory cell C of the row which is selected by the actuation of the word line WL. The logic state of the data bit output by the sense amplifier circuit SA is latched by a bit latch (Latch) circuit. In connection with the data read operation, the output from each Latch circuit coupled through multiplexing circuitry MUX to a data output line Q(0), . . . , Q(k−1) for a corresponding bit of the data output port. In connection with a data write operation for the SRAM 12, the multiplexing circuitry MUX couples a data input line D(0), . . . , D(k−1) for a corresponding bit of the data input port to the bit lines BL to write data into the memory cells C.

A control (CTRL) circuit 20 for the memory 10 generates a set of control signals 22 that are applied to the I/O circuitry 16 to control its operation. The control signals 22 include, for example, a precharge control signal for the precharge circuits PCH, a multiplexer control signal for the multiplexing circuitry MUX, and a sense amplifier enable (SAEN) signal for the sense amplifier circuits SA. Details of the circuitry for the control circuit 20 are not provided as such circuitry is well known to those skilled in the art.

Reference is further made to FIG. 2 which shows a block diagram of a circuit 30 including an SRAM 10 (like that shown in FIG. 1) that is configured to store data. In a particular application, the stored data is histogram data where each data word location (dw loc) in the memory core 12 of the memory 10 stores a count value (Count). For the memory 10 of FIG. 1, for example, the k memory cells C of each row at a given memory address location form a bin which stores a k-bit data word corresponding to the count value (Count) of the histogram. The bit stored in the memory cell C of column 0 is the least significant bit (LSB) of the count value and the bit stored in the memory cell C of column k−1 is the most significant bit (MSB) of the count value. As part of the operation of the circuit 30 for building a histogram, the count value is modified in some way (for example, incremented by one) each time the data word location is accessed. This operation typically involves three steps: step 1) reading the k-bit current count value from a particular data word location accessed in response to an m-bit memory address (Address); step 2) mathematically modifying the current count value (for example, incrementing (by one, for example)); and step 3) writing the modified count value back to the SRAM 12 at the accessed data word location. The step 2) operation for mathematically modifying the count value is performed here by a data modification circuit 32 that is external to (and separate from) the memory 10. The data modification circuit 32 is coupled to the data output (Q) port and data input (D) port of the memory 10 through one or more k-bit data bus circuits. As an example, the data modification circuit 32 may comprise a k-bit adder circuit that operates on the current count value read from the memory at the data output (Q) to increment by one and output the modified count value to be written back to the memory at the data input (D).

Reference is now made to FIG. 3 which shows a timing diagram for the operation of the circuit 30. At time t1, the chip select signal (CSN) is asserted logic low to select the SRAM 10 and the write enable signal (WEN) is deasserted logic high to place the SRAM 10 in data read mode. At time t2, the memory address (Address) is applied and the clock signal CLK pulses a first time to initiate a read operation. The Address is decoded by the SRAM 10 and the signal on the word line (WL) coupled to the data word location (dw loc) corresponding to the decoded Address is asserted logic high at time t3. The count value (Count) is then read (step 1) from the addressed data word location in the memory core 12 and output at time t4 through the data output (Q) port of the SRAM 10. The chip select signal (CSN) is then deasserted logic high at time t5 to deselect the SRAM 10 so that the SRAM 10 does not perform an operation in response to the next pulse of the clock signal CLK. At time t6, the clock signal CLK pulses a second time to cause the data modification circuit 32 to perform the mathematical modify operation (step 2) at time t7, which in this example case is an increment by one (+1) operation. The modified count value (Count+1) is then applied by the data modification circuit 32 to the data input (D) port of the SRAM 10 at time t8. At time t9, the write enable signal (WEN) is asserted logic low to place the SRAM 10 in write mode. The chip select signal (CSN) is then asserted logic low at time t10 to select the SRAM 10. At time t11, the memory address (Address) is applied (e.g., in actuality it remains applied from the read) and the clock signal CLK pulses a third time to initiate a data write operation. The Address is decoded by the SRAM 10 and the signal on the word line (WL) coupled to the data word location (dw loc) is asserted logic high at time t12. The modified count value (Count+1) is then written (step 3) from the data input port of the SRAM 10 at time t13 to the addressed data word location.

There are a number of concerns with the circuit 30 of FIG. 2 and its operation as detailed in FIG. 3. The circuit operation is multi-cycle in that it requires three clock cycles and two separate word line signal assertions to complete. Because of this multi-cycle operation, there is significantly higher power consumption in the circuit 30 (particularly within the memory 10) due to data signal toggling. This power consumption concern is further magnified by the fact that the mathematical modify part of the operation (step 2) occurs external to the SRAM 10 thus there is a power requirement for toggling of data for the data signals at both the data output (Q) port and data input (D) port.

SUMMARY

In an embodiment, a memory circuit comprises: a memory core formed by an array of memory cells storing data words at rows, wherein said array is arranged to include a first sub-array storing less significant bits of said data words and a second sub-array storing more significant bits of said data words; wherein each row of the first sub-array is connected to a less significant word line and each row of the second sub-array is connected to a more significant word line; a row decoder circuit configured to receive an address, decode the received address and generate a first word line signal that is applied to a selected one of the less significant word lines for a certain data location based on the decoded address; a first read circuit configured to read less significant bits of a data word from the first sub-array in response to the first word line signal; a saturation detection circuit configured to determine whether the read less significant bits are in a saturated state and in response thereto generate a second word line signal that is applied to a selected one of the more significant word lines for said certain data location based on the decoded address; a first data modification circuit configured to perform a mathematical operation on the read less significant bits in order to produce modified less significant bits that are written back to the first sub-array; a second read circuit configured to read more significant bits of said data word from the second sub-array in response to the second word line signal; and a second data modification circuit configured to perform a mathematical operation on the read more significant bits in order to produce modified more significant bits that are written back to the second sub-array.

An embodiment further concerns a method for operating a memory circuit that includes an array of memory cells storing data words at rows, wherein said array is arranged to include a first sub-array storing less significant bits of said data words and a second sub-array storing more significant bits of said data words, and wherein each row of the first sub-array is connected to a less significant word line and each row of the second sub-array is connected to a more significant word line. The method comprises: applying a first word line signal to a selected one of the less significant word lines for a certain data location to read less significant bits of a data word from the first sub-array; first performing a mathematical operation on the read less significant bits in order to produce modified less significant bits that are written back to the first sub-array; determining whether the read less significant bits are in a saturated state and if so then applying a second word line signal to a selected one of the more significant word lines for said certain data location to read more significant bits of said data word from the second sub-array; and second performing a mathematical operation on the read more significant bits in order to produce modified more significant bits that are written back to the second sub-array.

BRIEF DESCRIPTION OF THE DRAWINGS

For a better understanding of the embodiments, reference will now be made by way of example only to the accompanying figures in which.

DETAILED DESCRIPTION

Figure 1:
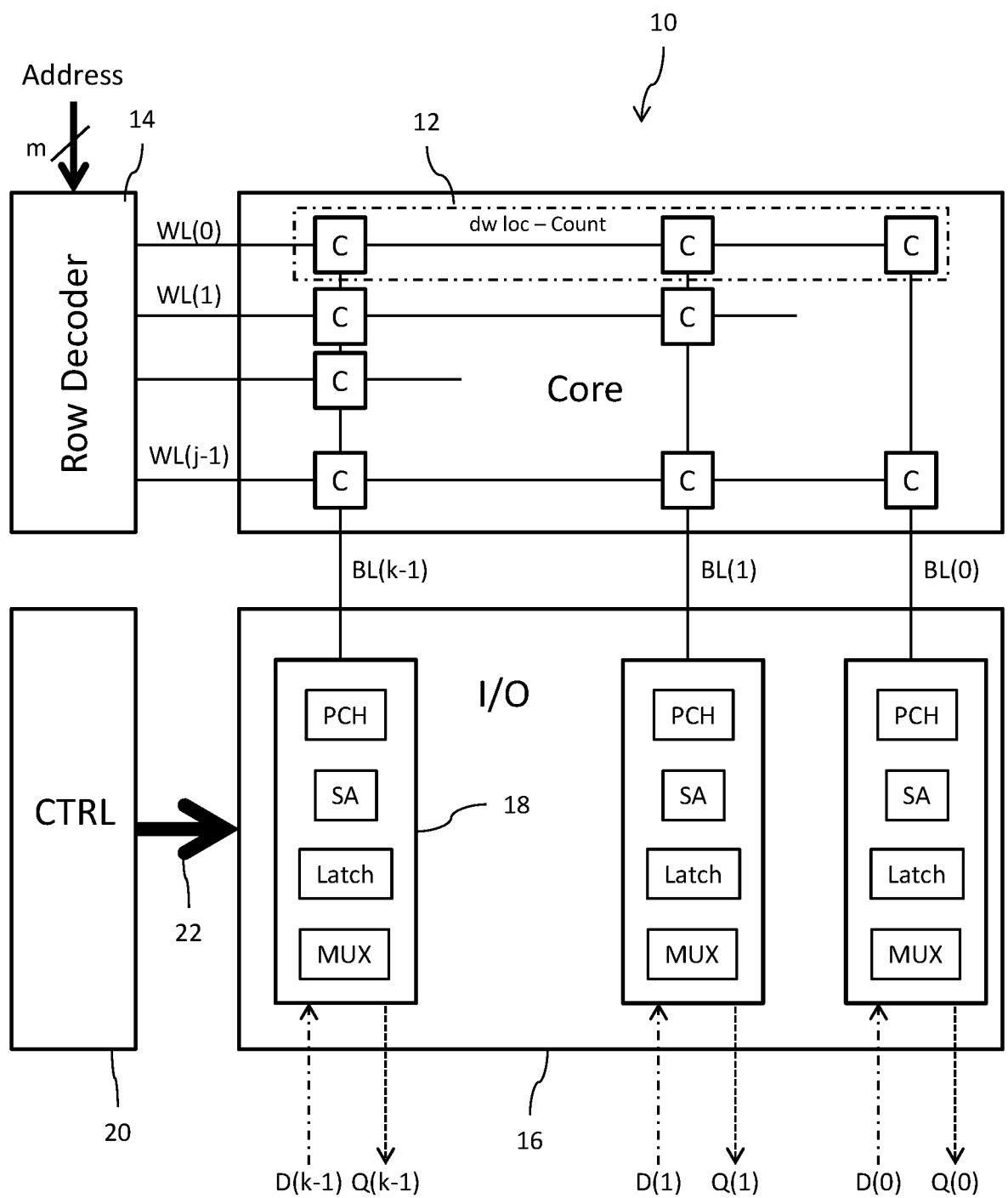
FIG. 1 shows a block diagram of a static random access memory (SRAM) circuit.
Figure 2:
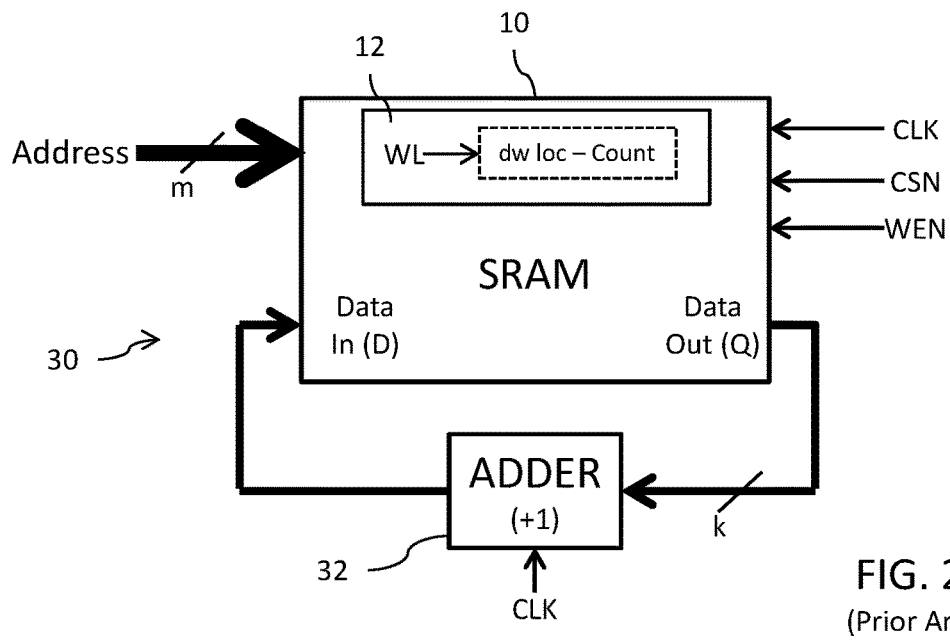
FIG. 2 shows a block diagram of a circuit configured to perform a read-modify-write operation with respect to a count value stored in the SRAM using an external modify circuit.
Figure 3:
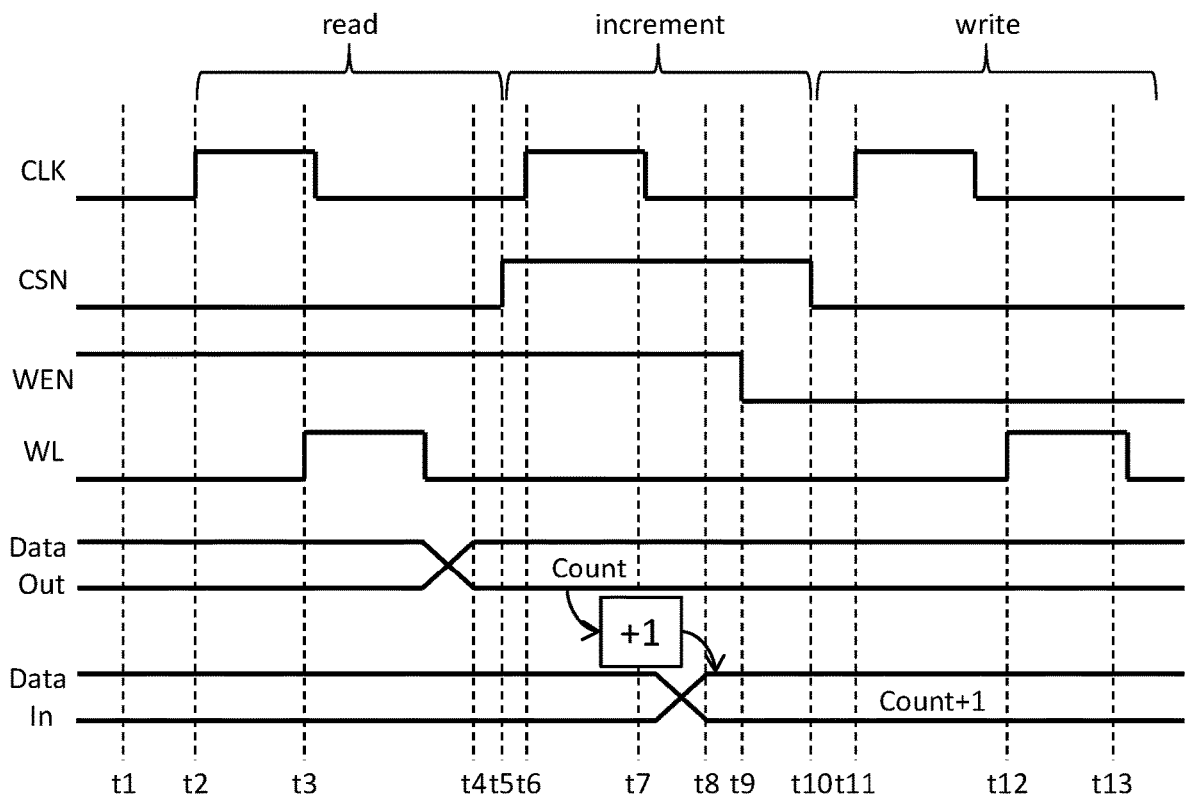
FIG. 3 shows a timing diagram for operation of the circuit of FIG. 2.
Figure 4:
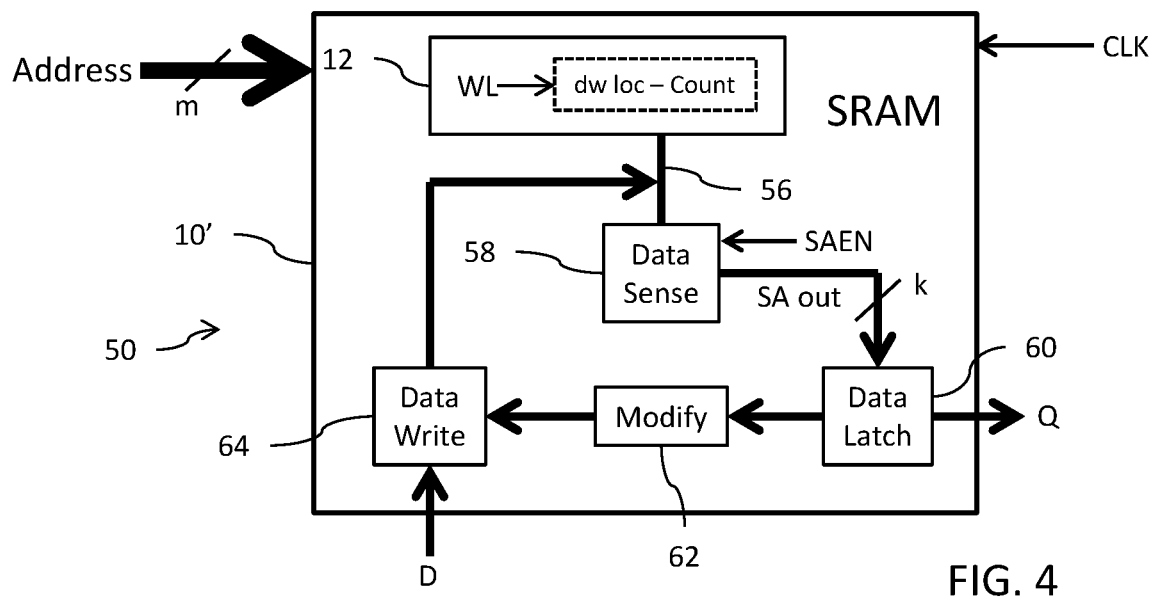
FIG. 4 shows is a block diagram of a circuit configured to perform a read-modify-write operation with respect to a count value stored in a static random access memory (SRAM) using an internal modify circuit.

Reference is made to FIG. 4 which shows a block diagram of a circuit 50 including a static random access memory (SRAM) 10' that is configured to store data using a core 12 like that shown in FIG. 1. In a particular application, the stored data is histogram data where the k bits at each data word location (dw loc) in the SRAM 10' stores a count value (Count). As part of the operation of the circuit 50 for building a histogram, the count value is modified in some way (for example, incremented by one) each time the data word location is accessed. As previously noted, this operation typically involves three steps: step 1) reading the k-bit current count value from a particular data word location accessed in response to an m-bit memory address (Address); step 2) mathematically modifying the current count value (for example, incrementing by one); and step 3) writing the modified count value back to the particular data word location in the SRAM 10'. In the circuit 30 of FIG. 2, the step 2) operation for mathematically modifying the count value was performed external to the memory 10 by circuit 32. Here in FIG. 4, however, the step 2) operation is instead performed internally within the SRAM 10' by circuit 62. Because of this, there is no need to toggle data signals at the data output (Q) port and data input (D) port of the SRAM 10', and there is no external data calculation operation performed, and thus there is a significant reduction in power consumption in comparison to the solution shown in FIG. 2. Still further, by internally performing the mathematical modify operation, there is no implication of external circuitry and the overall operation can be performed by the SRAM itself in a single clock cycle.

The SRAM 10' is clocked by a clock signal CLK and includes a memory array 12 comprising a plurality of k-bit accessible data word locations (dw loc). In response to an applied m-bit memory address (Address) and a pulsing of the clock signal CLK, a signal on the word line WL is asserted to select and access one of the data word locations in the memory array 12. The bit lines 56 of the memory array 12 are coupled to a data sensing circuit 58. The data sensing circuit 58 is formed by a plurality of sense amplifiers (one sense amplifier per data bit of the k-bit data word at the accessed data word location like that shown in FIG. 1). The data sensing circuit 58 is enabled to perform the data sensing operation on the bit lines 56 in response to assertion of a sense amplifier enable (SAEN) signal in order to read the data word (i.e., the count value (Count)) from the accessed data word location in the memory array 12. The timing of assertion of the SAEN signal can be controlled following the leading edge of the clock signal CLK based on a dummy read operation performed by the SRAM 10'. This ensures that the sense amplifiers are not enabled to drive voltages on the sense amplifier output (SA out) lines until it is clear that the data bits are available in response to assertion of the word line signal. A data latch circuit 60 then latches the read data word (here, the count value) from the SA out lines. The data latch circuit 60 is formed by a plurality of latches (one latch per sense amplifier like that shown in FIG. 1). A data modification circuit 62 that is internal to the SRAM 10' performs a data modification on the latched data word. As an example, the data modification circuit 62 may comprise a k-bit adder circuit that operates on the latched data word (which is the current count value stored in the memory) to increment by one and output the modified data word (i.e., Count+1). The timing of completion of the data modification operation can be detected by the SRAM 10' for the purpose of controlling when to begin the write phase. This ensures that the data to be written back to the memory is an accurate modification. A data write circuit 64 then writes the data bits of the modified data word back to the bit lines 56 to be stored at the accessed data word location in the memory array 12. The data write circuit 64 can use write driver circuits (one such circuit per column). It will be noted that because of read multiplexing circuitry, not explicitly shown, the data sensing circuit 58 at this point in time has been disconnected from the bit lines and the SAEN signal is no longer asserted. Following completion of the data write, the word line signal is deasserted. The timing of completion of the write operation can be controlled based on a dummy write operation performed by the SRAM 10'. This ensures that the data bits of the modified data word remain on the bit lines 56 for a sufficient amount of time to permit successful write back into the memory cells C.

Figure 5:
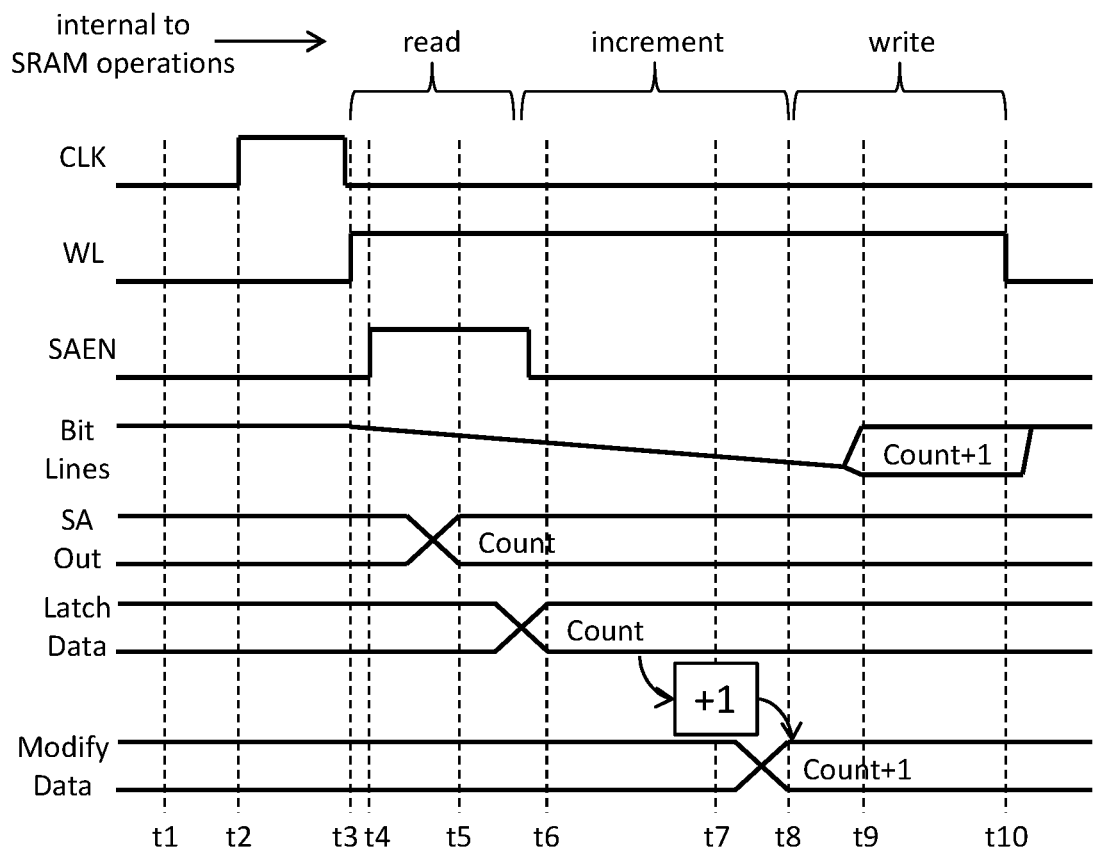
FIG. 5 shows a timing diagram for operation of the circuit of FIG. 4.

Reference is now made to FIG. 5 which shows a timing diagram for operation of the circuit 50. At time t1, the SRAM 10' is enabled for operation and the bit lines 56 are precharged to a precharge voltage level (shown here, by example only, at Vdd). At time t2, the memory address (Address) is applied and the clock signal CLK pulses. The Address is decoded by the row decoder of the SRAM 10' and a signal on the word line (WL) coupled to the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable (SAEN) signal is asserted logic high to enable operation of the sense amplifiers within the data sensing circuit 58. The sense amplifiers respond at time t5 to sense the voltage on the bit lines 56 and drive corresponding output signals (SA out) from the data sensing circuit 58 to logic high or logic low levels dependent on the logic state of the bits of the data word stored in the accessed data word location. Thus, the data word has been read (step 1) from the memory array 12 and the output of the data sensing circuit 58 now reflects the count value (Count). The data latch circuit 60 latches the read data word from the output of the data sensing circuit 58 at time t6, and thus the latched data also reflects the count value (Count). The data modification circuit 62 then performs the mathematical modify operation (step 2) at time t7, which in this example case is an increment by one (+1) operation, and the output modified data from the data modification circuit 62 at time t8 reflects the incremented count value (Count+1). The data write circuit 64 then applies the data bits of the modified data word back to the bit lines 56 (noting here that the voltage of the bit line(s) has continued to slowly discharge in response to the assertion of the wordline signal). Because the signal on the word line (WL) remains asserted logic high, the modified data word is then written (step 3) at time t9 for storage at the accessed data word location in the memory array 12. Following completion of the data write operation, a reset is performed and the signal on the word line (WL) is deasserted logic low at time t10. Note here that the entire read-modify-write operation is performed within a single cycle of the clock CLK.

Notwithstanding the improvement in performance of the circuit 50 of FIG. 4 compared to the circuit 30 of FIG. 20, there still remains a concern with overall power consumption. It will be noted that the assertion of the wordline WL is made as to all bit cells C at the addressed memory location and thus a read and write within the single clock cycle is being made at all of the bit cells. There is a need to further address these power consumption concerns and provide a more efficient implementation of the single-cycle read-modify-write operation.

Figure 6A:
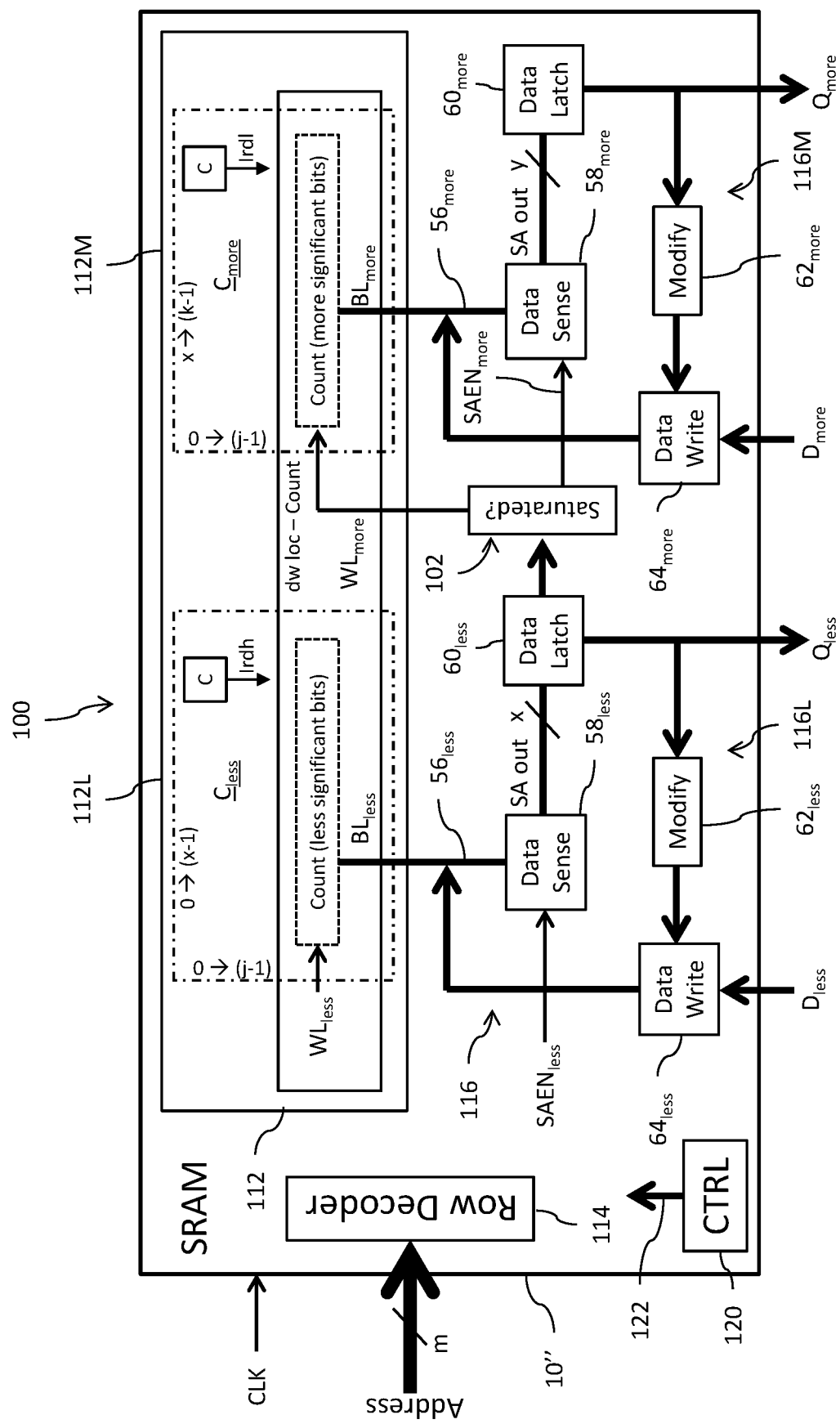
FIG. 6A shows a block diagram of a circuit configured to perform a read-modify-write operation using an SRAM circuit with a modular memory architecture including sub-arrays where word lines activation for the more significant sub-array is dependent on data content read from the less significant sub-array during a read-modify-write operation using an internal modify circuit.
Figure 6B:
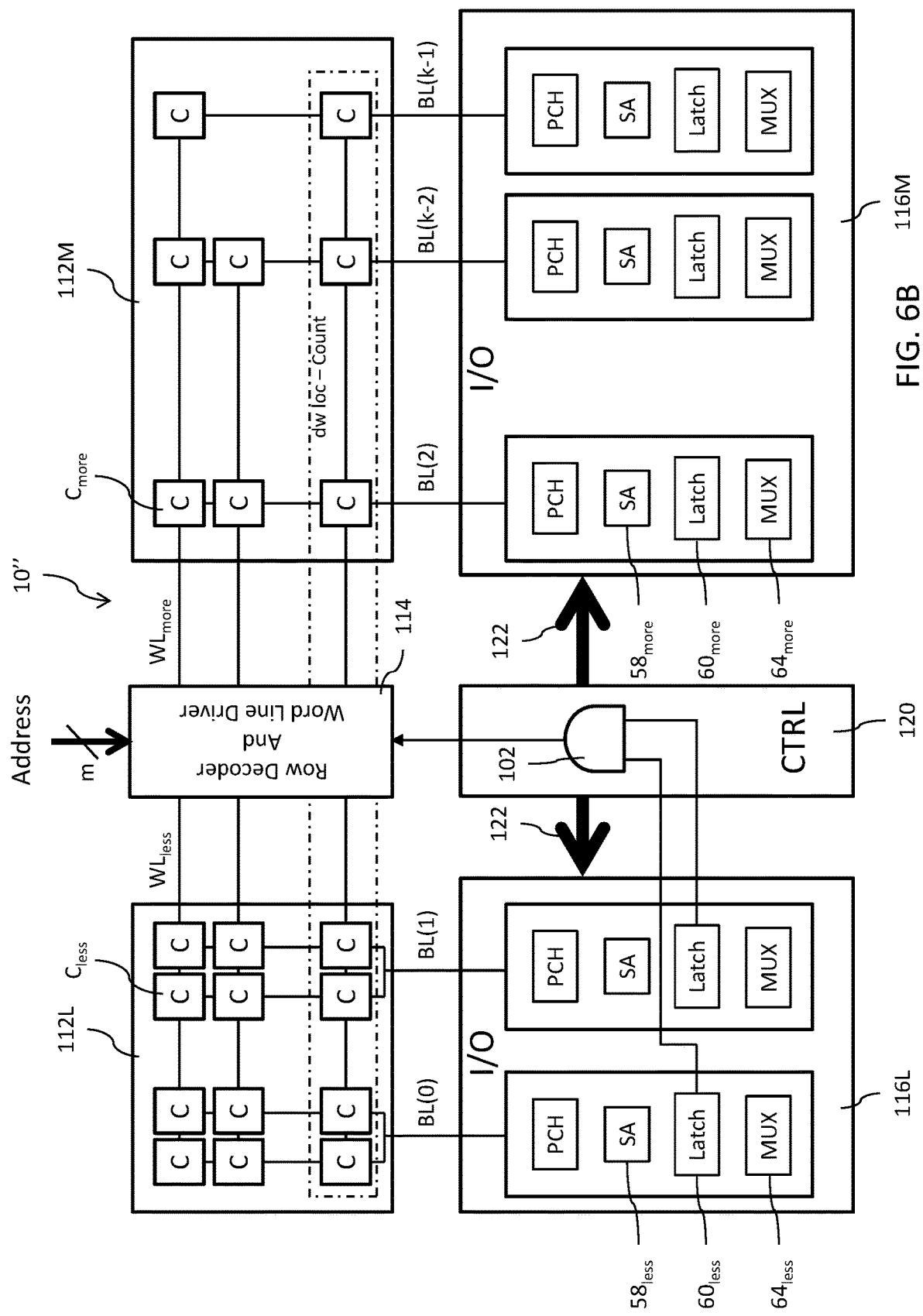
FIG. 6B shows a block diagram of the SRAM array.

Reference is made to FIG. 6A which shows a block diagram of a circuit 100 including a static random access memory (SRAM) 10" that is configured to store data, and FIG. 6B which shows a block diagram of the SRAM array. The memory 10" includes a memory core 112 formed by a plurality of SRAM cells (C) (for example, of the 6T or 8T type as is well known in the art) like those shown with the core 12 in FIG. 1. The overall array for the core 112 is arranged to include j rows and k columns, and this overall array differs from the FIG. 1 implementation in that it is divided into a modular architecture with a first sub-array 112L (for LESS significant bit storage) including j rows ($0 \rightarrow (j-1)$) and x columns ($0 \rightarrow (x-1)$) and a second sub-array 112M (for MORE significant bit storage) including j rows ($0 \rightarrow (j-1)$) and y=k-x columns ($x \rightarrow (k-1)$). The division of columns between the first and second sub-arrays 112L and 112M need not be equal and is preferably not equal with x<y in preferred implementations.

In a particular application, the data stored in the memory 10″ is histogram data where each data word location (dw loc) in the memory core 112 stores a count value (Count). For the memory 10″ of FIG. 6A, for example, the k memory cells C of each row at a given memory address location form a bin which stores a k-bit data word corresponding to the count value (Count) of the histogram. The bit stored in the memory cell of column 0 of the data word location is the least significant bit (LSB) of the count value and the bit stored in the memory cell of column k-1 of that data word location is the most significant bit (MSB) of the count value. Thus, it will be understood that the first sub-array 112L, which includes memory cells $C_{less}$ storing x bits 0 to x-1 of the count values, forms a LESS significant sub-array of the core 112 for storing the LESS significant bits portion of the Count. The second sub-array 112M, which includes memory cells $C_{more}$ storing y bits x to k-1 of the count values, forms a MORE significant sub-array of the core 112 for storing the MORE significant bits portion of the Count.

The cells C in each row of the memory core 112 are coupled to a corresponding word line (WL), and the cells in each column are coupled to at least one corresponding bit line (BL). More specifically, the cells $C_{less}$ in a row of the sub-array 112L are coupled to a corresponding word line $WL_{less}$, and the cells $C_{more}$ in a row of the sub-array 112M are coupled to a corresponding word line $WL_{more}$. In an implementation using the 6T type SRAM circuit, a pair of complementary bit lines is present and is used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell.

The memory 10″ further includes a row decoder circuit 114 that is configured to receive an m-bit memory address (Address). The row decoder circuit 114 decodes the received memory address and selectively actuates one word line $WL_{less}$ for the sub-array 112L which corresponds to the decoded memory address in the memory core 112 specifying a certain data word location (dw loc) where the word line is asserted. Details of the circuitry for the row decoder circuit 114 are not provided as such circuitry is well known to those skilled in the art. Selective actuation of one word line $WL_{more}$ for the sub-array 112M is controlled in a different manner as discussed in more detail herein that is dependent on the data stored in the sub-array 112L.

In view of the modular architecture where the core 112 is divided into a first sub-array 112L and a second sub-array 112M, there are distinct word lines connected to the memory cells $C_{less}$ in the first sub-array 112L and connected to the memory cells $C_{more}$ in the second sub-array 112M. Specifically, the memory cells $C_{less}$ in rows of the first sub-array 112L are driven by signals on less significant word lines $WL_{less}$ and the memory cells $C_{more}$ in rows of the second sub-array 112M are driven by signals on more significant word lines $WL_{more}$. The signals on the less significant word lines $WL_{less}$ are generated by the row decoder circuit 114 in response to the decoded Address. The signals on the more significant word lines $WL_{more}$, however, are generated by a saturation circuit 102 (or through the row decoder 114 in response to an output of the saturation circuit 102) in a manner to be described in more detail herein that is dependent on the data stored in the memory cells $C_{less}$ in the first sub-array 112L for the addressed data word location. Generally speaking, the saturation circuit 102 will assert (or cause the assertion of) the signal on the corresponding more significant word line $WL_{more}$ for the row of memory cells $C_{more}$ at the data word location addressed by the decoded Address only if the memory cells $C_{less}$ for the less significant bits portion of the Count accessed by the signal for the less significant word line $WL_{less}$ at the data word location addressed in response to the decoded Address are in a saturated data state (i.e., the cells $C_{less}$ for all x bits are storing a logic "1"). Conversely, the signal on the corresponding more significant word line $WL_{more}$ is inhibited when the saturated data state for the LESS significant bits is not present.

Data input/output (I/O) circuitry 116 for the memory 10″ is divided in accordance with the modular architecture of the memory core 112 into first I/O circuitry 116L connected to the bit lines $BL_{less}$ of the first sub-array 112L for the x LESS significant bits of the Count and second I/O circuitry 116M connected to the bit lines $BL_{more}$ of the second sub-array 112M for the y MORE significant bits of the Count. The circuitry 116L includes data sense circuits $58_{less}$ (formed by sense amplifiers) coupled to the less significant bit lines $56_{less}$ and configured to sense the logic state of the cells $C_{less}$, data latching circuits $60_{less}$ (formed by latch circuits) configured to latch the LESS significant bits sensed by the data sense circuits $58_{less}$, data modifying circuits $62_{less}$ configured to implement the internal increment operation on the latched LESS significant bits (not explicitly shown in FIG. 6B but, for example, implemented through serial connected adder circuits receiving the latched data bits as input), and data write circuits $64_{less}$ (formed by write drivers with MUX circuits) configured to write the incremented value back to the cells $C_{less}$ through the bit lines $56_{less}$. The circuitry 116M includes data sense circuits $58_{more}$ (formed by sense amplifiers) coupled to the more significant bit lines $56_{more}$ and configured to sense the logic state of the cells $C_{more}$, data latching circuits $60_{more}$ (formed by latch circuits) configured to latch the MORE significant bits sensed by the data sense circuits $58_{more}$, data modifying circuits $62_{more}$ configured to implement the internal increment operation on the latched MORE significant bits (not explicitly shown in FIG. 6B but, for example, implemented through serial connected adder circuits receiving the latched data bits as input), and data write circuits $64_{more}$ (formed by write drivers with MUX circuits) configured to write the incremented value back to the cells $C_{more}$ through the bit lines $56_{more}$.

A control (CTRL) circuit 120 for the memory 10″ generates a set of control signals 122 that are applied to the I/O circuitry 116 to control its operation. The control signals 122 include, for example, a precharge control signal for the precharge circuits PCH, a multiplexer control signal for the multiplexing circuitry MUX, and a sense amplifier enable signal for the sense amplifier circuits SA. Details of the circuitry for the control circuit 120 are not provided as such circuitry is well known to those skilled in the art.

The data sense circuits $58_{less}$ are enabled for operation by a sense amp enable signal $SAEN_{less}$ that is asserted by the control circuit 120. The saturation circuit 102 is coupled to receive the latched LESS significant bits (as sensed by the data sense circuits $58_{less}$) from the data latching circuits $60_{less}$. The saturation circuit 102 determines whether a saturation condition exists with respect to the latched LESS significant bits (i.e., are all bits are logic "1"?) and responds thereto by asserting the sense amp enable signal $SAEN_{more}$ to enable the data sense circuits $58_{more}$ and also assert the signal for the corresponding more significant word line $WL_{more}$. Conversely, if the saturation condition does not exist, assertion of the signal for the corresponding more significant word line $WL_{more}$ is inhibited. If the more significant word line $WL_{more}$ is inhibited, circuitry of the memory 10" associated with the MORE significant bits is disabled and thus has a reduced power consumption. In an embodiment, the saturation circuit 102 is a logic circuit (for example, a logical AND gate, as shown in FIG. 6B) that logically combines the latched LESS significant bits.

As part of the operation of the circuit 100 for building a histogram, the count value is modified in some way (for example, incremented by one) each time the data word location is accessed. As previously noted, this operation typically involves three steps: step 1) reading the current count value from a particular data word location accessed in response to an m-bit memory address (Address); step 2) mathematically modifying the current count value (for example, incrementing by one); and step 3) writing the modified count value back to the particular data word location in the SRAM 10". In the circuit 100, the step 1) and step 3) operations for reading and writing are performed each time for the first sub-array 112L, but are only selectively performed for the second sub-array 112M dependent on the data read from the first sub-array 112L. Furthermore, in the circuit 100, the step 2) operation for mathematically modifying the count is performed internally within the SRAM 10" using the data modifying circuit $62_{less}$ each time, and only selectively performed internally using the data modifying circuit $62_{more}$ when there is reading and writing performed with respect to the second sub-array 112M.

The SRAM 10" is clocked by a pulse of the clock signal CLK. In response to an applied m-bit memory address (Address) and a pulsing of the clock signal CLK, a signal on a word line $WL_{less}$ is asserted by the row decoder 114 to select and access memory cells $C_{less}$ of the first sub-array 112L at one of the data word locations in the memory array 112 storing the LESS significant bits of the Countless. The bit lines $56_{less}$ of the memory array 112 are coupled to the data sensing circuit $58_{less}$. The data sensing circuit $58_{less}$ is formed by a plurality of sense amplifiers (one sense amplifier per data bit of the x LESS significant bits of the data word at the accessed data word location like that shown in FIG. 1). The data sensing circuit $58_{less}$ is enabled to perform the data sensing operation on the bit lines $56_{less}$ in response to assertion of the sense amplifier enable signal $SAEN_{less}$ in order to read the LESS significant bits of the count value (Countless) from the first sub-array 112L. The timing of assertion of the $SAEN_{less}$ signal can be controlled following the leading edge of the clock signal CLK based on a dummy read operation performed by the SRAM 10". This ensures that the sense amplifiers are not enabled to drive voltages on the sense amplifier output (SA out) lines until it is clear that the data bits are available in response to assertion of the signal on the word line $WL_{less}$. A data latch circuit $60_{less}$ then latches the LESS significant bits of the read count value from the SA out lines. The data latch circuit includes a latch for each sense amplifier like that shown in FIG. 1. A data modification circuit $62_{less}$ that is internal to the SRAM 10" performs a data modification on the latched LESS significant bits of the data word. As an example, the data modification circuit $62_{less}$ may comprise an x-bit adder circuit that operates on the latched LESS significant bits of the data word to increment by one and output the modified LESS significant bits of the data word (i.e., Count+$1_{less}$). The timing of completion of the data modification operation can be detected by the SRAM 10" for the purpose of controlling when to begin the write phase. This ensures that the data to be written back to the cells $C_{less}$ of the first sub-array 112L is an accurate modification. A data write circuit $64_{less}$ then writes the LESS significant bits of the modified data word Count+$1_{less}$ back to the bit lines $56_{less}$ to be stored at the accessed data word location in the first sub-array 112L. A suitable write driver is provided in the circuit $64_{less}$ for each column of the sub-array 112L. It will be noted that because of read multiplexing circuitry, not explicitly shown, the data sensing circuit $58_{less}$ at this point in time has been disconnected from the bit lines and the $SAEN_{less}$ signal is no longer asserted. Following completion of the data write, the signal on the word line $WL_{less}$ is deasserted. The timing of completion of the write operation can be controlled based on a dummy write operation performed by the SRAM 10". This ensures that the LESS significant bits of the modified data word Count+$1_{less}$ remain on the bit lines $56_{less}$ for a sufficient amount of time to permit successful write back into the memory cells $C_{less}$.

The saturation circuit 102 receives the latched LESS significant bits of the data word (Countless) from the data latch circuit $60_{less}$ and tests for satisfaction of the saturation condition (i.e., all x-bits are logic "1"). If the saturation condition is not satisfied (i.e., any one of the x-bits is logic "0"), then the circuitry associated with processing (reading, incrementing, writing) the MORE significant bits of the Count value for the second sub-array 112M is not activated. So, in such a case, neither the second sub-array 112M nor the second I/O circuitry 116M is enabled for operation. Conversely, if the saturation condition is satisfied (i.e., all x-bits are logic "1"), then saturation circuit 102 will assert both the signal on the word line $WL_{more}$ (for the memory cells $C_{more}$ of the second sub-array 112M at the addressed data word location) and the sense amplifier enable signal $SAEN_{more}$.

With the saturation condition satisfied, and still responsive to the pulse of the clock signal CLK noted above, the signal on the word line $WL_{more}$ is asserted by (or through the decoder 114 in response to) the saturation circuit 102 to select and access memory cells $C_{more}$ of the second sub-array 112M at said data word location in the memory array 112 storing the MORE significant bits of the $Count_{more}$. The bit lines $56_{more}$ of the memory array 112 are coupled to the data sensing circuit $58_{more}$. The data sensing circuit $58_{more}$ is formed by a plurality of sense amplifiers (one sense amplifier per data bit of the y MORE significant bits of the data word at the accessed data word location like that shown in FIG. 1). The data sensing circuit $58_{more}$ is enabled to perform the data sensing operation on the bit lines $56_{more}$ by the saturation circuit 102 through control circuit 120 actuation of the sense amplifier enable signal $SAEN_{more}$ in order to read the MORE significant bits of the count value (Count from the second sub-array 112M. The timing of assertion of the $SAEN_{more}$ signal can be controlled following the leading edge of the signal on the word line $WL_{more}$ based on a dummy read operation performed by the SRAM 10". This ensures that the sense amplifiers are not enabled to drive voltages on the sense amplifier output (SA out) lines until it is clear that the data bits are available in response to assertion of the signal on the word line $WL_{more}$. A data latch circuit $60_{more}$ then uses its latching circuits to latch the MORE significant bits of the read count value from the SA out lines. A data modification circuit $62_{more}$ that is internal to the SRAM 10" performs a data modification on the latched MORE significant bits of the data word. As an example, the data modification circuit $62_{more}$ may comprise a y-bit adder circuit that operates on the latched MORE significant bits of the data word to increment by one and output the modified MORE significant bits of the data word (i.e., Count+$1_{more}$) The timing of completion of the data modification operation can be detected by the SRAM 10" for the purpose of controlling when to begin the write phase. This ensures that the data to be written back to the cells $C_{more}$ of the second sub-array 112M is an accurate modification. Write drivers of a data write circuit $64_{more}$ then write the MORE significant bits of the modified data word Count+$1_{more}$ back to the bit lines $56_{more}$ to be stored at the accessed data word location in the second sub-array 112M. It will be noted that because of read multiplexing circuitry, not explicitly shown, the data sensing circuit $58_{more}$ at this point in time has been disconnected from the bit lines and the $SAEN_{more}$ signal is no longer asserted. Following completion of the data write, the signal on the word line $WL_{more}$ is deasserted. The timing of completion of the write operation can be controlled based on a dummy write operation performed by the SRAM 10". This ensures that the MORE significant bits of the modified data word Count+$1_{more}$ remain on the bit lines $56_{more}$ for a sufficient amount of time to permit successful write back into the memory cells $C_{more}$.

Figure 7A:
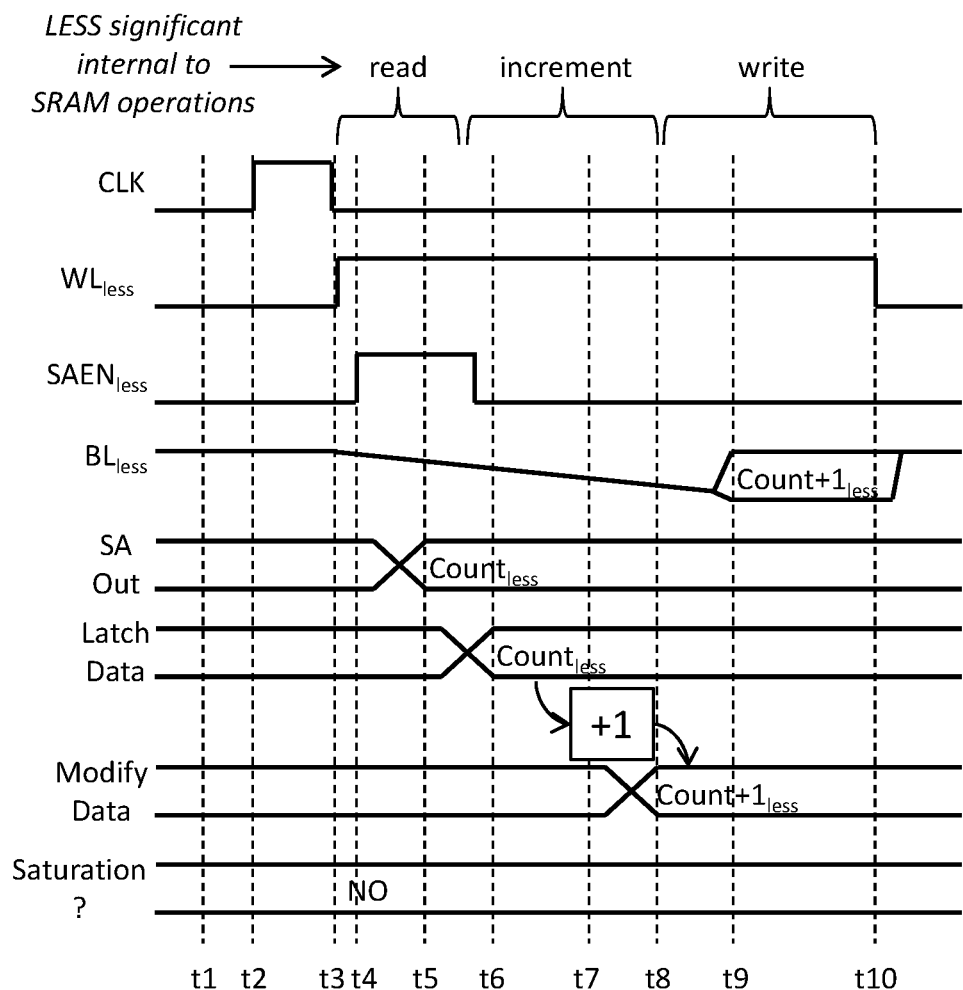
FIGS. 7A and 7B show timing diagrams for operation of the circuit of FIG. 6.

Reference is now made to FIG. 7A which shows a timing diagram for operation of the circuit 100 in a first condition where the x LESS significant bits stored in the memory have a first characteristic as noted below. At time t1, the SRAM 10" is enabled for operation and the bit lines 56 are precharged to a precharge voltage level (shown here, by example only, at Vdd). At time t2, the memory address (Address) is applied and the clock signal CLK pulses. The Address is decoded by the row decoder 114 of the SRAM 10" and the signal on the word line $WL_{less}$ coupled to the cells $C_{less}$ in the first sub-array 112L for the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable signal $SAEN_{less}$ is asserted logic high to enable operation of the sense amplifiers within the data sensing circuit $58_{less}$. The sense amplifiers respond at time t5 to sense the voltage on the bit lines $56_{less}$ and drive corresponding output signals (SA out) from the data sensing circuit $58_{less}$ to logic high or logic low levels dependent on the logic state of the x LESS significant bits of the data word stored in the accessed data word location. Thus, the LESS significant bits of the data word have been read (step 1) from the memory array 12 and the output of the data sensing circuit $58_{less}$ now reflects the LESS significant bits of the count value (Countless). The latches of the data latch circuit $60_{less}$ latch the read data word from the output of the data sensing circuit $58_{less}$ at time t6, and thus the latched data also reflects the count value (Countless). Let's assume here that the first characteristic is that at least one bit of the x LESS significant bits is logic "0" (for example, if x=2, then Countless equals "0,0", "0,1" or "1,0"). In such a case with at least one bit at logic "0", the saturation circuit 102 does not detect the saturation condition and its sensing state is "NO," and there is no enabling through the saturation circuit 102, the decoder circuit 114 and/or the control circuit 122 of processing operations with respect to the MORE significant bits. The data modification circuit $62_{less}$ then performs the mathematical modify operation (step 2) at time t7 on the x LESS significant bits, which in this example case is an increment by one (+1) operation, and the output modified data from the data modification circuit $62_{less}$ at time t8 reflects the incremented count value (Count+$1_{less}$)—for example: "0,0" incrementing to "0,1"; "0,1" incrementing to "1,0"; or "1,0" incrementing to "1,1". The write drivers of the data write circuit $64_{less}$ then apply the data bits of the modified data word Count+$1_{less}$ for the x LESS significant bits back to the bit lines $56_{less}$ (noting here that the voltage of the bit line(s) has continued to slowly discharge in response to the assertion of the wordline signal). Because the signal on the word line $WL_{less}$ remains asserted logic high, the modified data word Count+$1_{less}$ is then written (step 3) at time t9 for storage at the cells $C_{less}$ in the first sub-array 112L for the accessed data word location in the memory array 112. Following completion of the data write operation, a reset is performed and the signal on the word line $WL_{less}$ is deasserted logic low at time t10.

It will be noted here that no matter the logic state of the y MORE significant bits in the cells $C_{more}$ of the second sub-array 112M, the is no access and increment operation that is performed on those MORE significant bits as long as the saturation condition is not satisfied (state=NO) with respect to the read and latched x LESS significant bits in the cells $C_{less}$ of the first sub-array 112L. Instead, the increment and write back is performed solely for the first sub-array 112L with respect to the x LESS significant bits. Take an example of the count value of <0,0,0,1,1,1,0,1> where <0,0,0,1,1,1> are they MORE significant bits (Count$_{more}$) in the cells $C_{more}$ of the second sub-array 112M at the addressed data word location (dw loc) and <0,1> are the x LESS significant bits (Countless) in the cells $C_{less}$ of the first sub-array 112L at the addressed data word location. Here, the Countless bits <0,1> are read and latched, the saturation condition is not satisfied because at least one of the bits is logic "0", the increment is performed to generating the bits <1,0> for the incremented count value (Count+$1_{less}$), and bits <1,0> are then written back to the cells $C_{less}$ of the first sub-array 112L. As a result, the incremented count value stored at the addressed data word location will be <0,0,0,1,1,1,1,0>.

Figure 7B:
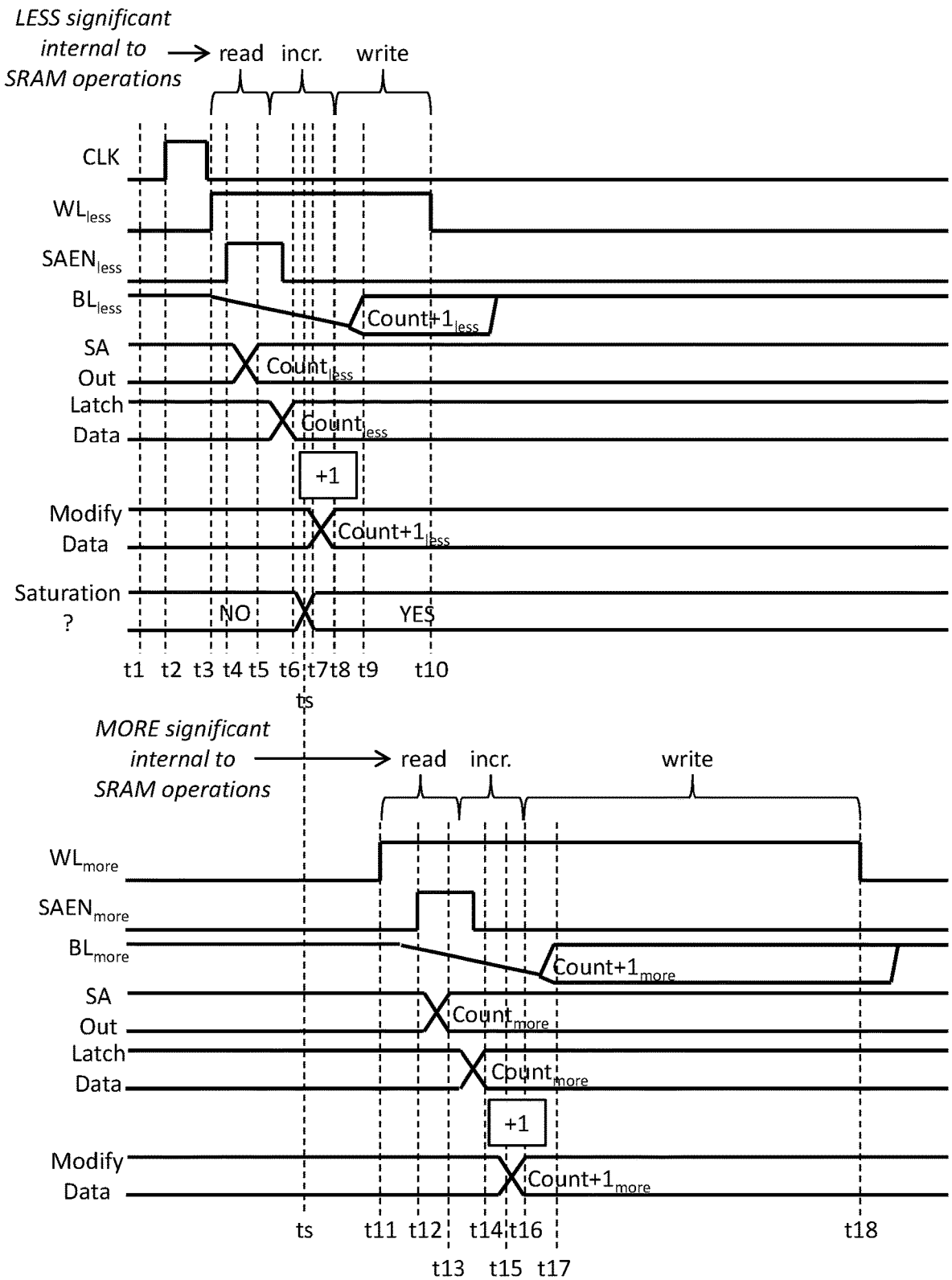

Reference is now made to FIG. 7B which shows a timing diagram for operation of the circuit 100 in a second condition where the x LESS significant bits stored in the memory have a second characteristic as noted below. At time t1, the SRAM 10" is enabled for operation and the bit lines 56 are precharged to a precharge voltage level (shown here, by example only, at Vdd). At time t2, the memory address (Address) is applied and the clock signal CLK pulses. The Address is decoded by the row decoder 114 of the SRAM 10" and the signal on the word line $WL_{less}$ coupled to the cells $C_{less}$ in the first sub-array 112L for the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable signal $SAEN_{less}$ is asserted logic high to enable operation of the sense amplifiers within the data sensing circuit $58_{less}$. The sense amplifiers respond at time t5 to sense the voltage on the bit lines $56_{less}$ and drive corresponding output signals (SA out) from the data sensing circuit $58_{less}$ to logic high or logic low levels dependent on the logic state of the x LESS significant bits of the data word stored in the accessed data word location. Thus, the LESS significant bits of the data word have been read (step 1) from the memory array 12 and the output of the data sensing circuit $58_{less}$ now reflects the LESS significant bits of the count value (Countless). The latches of the data latch circuit $60_{less}$ latch the read data word from the output of the data sensing circuit $58_{less}$ at time t6, and thus the latched data also reflects the count value (Countless). Let's assume here that the second characteristic is that all bits of the x LESS significant bits are logic "1" (for example, if x=2, then Countless equals "1,1"). In such a case with all bits at logic "1", the saturation circuit 102 detects the saturation condition and its sensing state changes to "YES" at time ts. The data modification circuit $62_{less}$ then performs the mathematical modify operation (step 2) at time t7 on the x LESS significant bits, which in this example case is an increment by one (+1) operation, and the output modified data from the data modification circuit $62_{less}$ at time t8 reflects the incremented count value (Count+$1_{less}$)—for example: "1,1" incrementing to "0,0". The write drivers of the data write circuit $64_{less}$ then apply the data bits of the modified data word Count+$1_{less}$ for the x LESS significant bits back to the bit lines $56_{less}$ (noting here that the voltage of the bit line(s) has continued to slowly discharge in response to the assertion of the wordline signal). Because the signal on the word line $WL_{less}$ remains asserted logic high, the modified data word Count+$1_{less}$ is then written (step 3) at time t9 for storage at the cells $C_{less}$ in the first sub-array 112L for the accessed data word location in the memory array 112. At time t11, the signal on the word line $WL_{more}$ coupled to the cells $C_{more}$ in the second sub-array 112M for the data word location (dw loc) corresponding to the decoded Address is asserted logic high (for example, through the decoder circuit 114) in response to the saturation circuit 102 (that action occurring in response to the change in state=YES at time ts). In response to the asserted word line signal and the logic state of the stored data, the voltage on the bit lines begins to discharge from Vdd. At time t12, the sense amplifier enable signal $SAEN_{more}$ is asserted logic high by the control circuit 120 to enable operation of the sense amplifiers within the data sensing circuit $58_{more}$. Following completion of the data write operation, the signal on the word line $WL_{less}$ is deasserted logic low at time t10. The sense amplifiers respond at time t13 to sense the voltage on the bit lines $56_{more}$ and drive corresponding output signals (SA out) from the data sensing circuit $58_{more}$ to logic high or logic low levels dependent on the logic state of the y MORE significant bits of the data stored in the accessed data word location. Thus, the MORE significant bits of the data word have been read (step 1) from the memory array 12 and the output of the data sensing circuit $58_{more}$ now reflects the MORE significant bits of the count value (Count$_{more}$) The latched of the data latch circuit $60_{more}$ latch the read data word from the output of the data sensing circuit $58_{more}$ at time t14, and thus the latched data also reflects the count value (Count$_{more}$). The data modification circuit $62_{more}$ then performs the mathematical modify operation (step 2) at time t15 on the y MORE significant bits, which in this example case is an increment by one (+1) operation, and the output modified data from the data modification circuit $62_{more}$ at time t16 reflects the incremented count value (Count+$1_{more}$)—for example: if y=6, "0,0,0,1,0,0" incrementing to "0,0,0,1,0,1". The data write circuit $64_{more}$ then applies the data bits of the modified data word Count+$1_{more}$ for the y MORE significant bits back to the bit lines $56_{more}$ (noting here that the voltage of the bit line(s) has continued to slowly discharge in response to the assertion of the wordline signal). Because the signal on the word line $WL_{more}$ remains asserted logic high, the modified data word Count+$1_{more}$ for the y MORE significant bits is then written (step 3) at time t17 for storage at the cells $C_{more}$ in the second sub-array 112M for the accessed data word location in the memory array 112. Following completion of the data write operation, the signal on the word line $WL_{more}$ is deasserted logic low at time t18.

The time needed to the perform the data write of the modified data word Count+$1_{more}$ to the cells $C_{more}$ through the bit lines $56_{more}$ takes longer than the time needed to perform the data write of the modified data word Count+$1_{less}$ to the cells $C_{less}$ through the bit lines $56_{m-less}$. The reason for this is that y>x and it takes longer to write the relatively larger number of y-bits to the second sub-array 112M than to write the relatively smaller number of x-bits to the first sub-array 112L.

It will be noted here that the access and increment operation that is performed on the MORE significant bits is wholly dependent on whether the saturation condition is satisfied (state=YES) with respect to the read and latched x LESS significant bits in the cells $C_{less}$ of the first sub-array 112L. If so, then the increment and write back is performed for both the first sub-array 112L and the second sub-array 112M. Take an example of the count value of <0,0,0,1,1,1,1,1> where <0,0,0,1,1,1> are they MORE significant bits (Count$_{more}$) in the cells $C_{more}$ of the second sub-array 112M at the addressed data word location (dw loc) and <1,1> are the x LESS significant bits (Countless) in the cells $C_{less}$ of the first sub-array 112L at the addressed data word location. Here, the Countless bits <1,1> are read and latched, the saturation condition is satisfied because all bits are logic "1", there is a first increment to generate the bits <0,0> for the incremented count value (Count+$1_{less}$), and these bits <0,0> are then written back to the cells $C_{less}$ of the first sub-array 112L, and there is a second increment to generate the bits <0,0,1,0,0,0> for the incremented count value (Count+$1_{more}$), and these bits <0,0,1,0,0,0> are then written back to the cells $C_{more}$ of the second sub-array 112M. As a result, the incremented count value stored at the addressed data word location will be <0,0,1,0,0,0,0,0>.

There is a sequential nature to the first and second increments that are performed in the case where the saturation condition is satisfied (state=YES) for the read and latched x LESS significant bits in the cells $C_{less}$ of the first sub-array 112L. This is due to the operation of the saturation circuit 102 which cannot trigger read, increment, write operations with respect to the MORE significant bits until detection of the saturation condition is made for the read and latched x LESS significant bits. This sequential operation can lead to an increase in cycle time for the read-modify-write operation. To address this concern with increased cycle time, an effort can be made to try and reduce the amount of time taken to read and latch the x LESS significant bits. To that end, a modification of the cells $C_{less}$ of the first sub-array 112L can be made in order to cause the cells to operate more quickly. One way to accomplish this is to design the cells $C_{less}$ of the first sub-array 112L to generate a higher read current Irdh to the bit lines $BL_{less}$ than the read current Irdl for the cells $C_{more}$ of the second sub-array 112M. Increasing the size of the cells $C_{less}$, for example having each bit location formed by two (or more) standard size cells connected in parallel (as shown specifically in FIG. 6B), will result in a higher read current.

It will further be noted that the somewhat parallel operations performed for the LESS and MORE significant bits for incrementing and writing back can result in a decrease in overall cycle time (notwithstanding the timing delay introduced by the operation of the saturation detection circuit) in comparison to prior art configurations. The cycle time is dependent on relative size of the sub-arrays 112L and 112M and the saturation detection circuit timing delay can be addressed through selection of the sub-array sizes. In cases where the cycle time is still considered too long, then the above-noted solution for generate a higher read current from the cells of the sub-array 112L can assist with improving overall timing and reduce the impact of the saturation detection circuit timing delay.

In the example where x=2 and y=6 (like that shown in FIG. 6B), only one out of every four accesses to a given data word location dw loc will necessitate performing a read-increment-write operation with respect to both the first sub-array 112L and the second sub-array 112M. Specifically, cells $C_{less}$ of the first sub-array 112L can store only four possible count values Countless of <0,0>, <0,1>, <1,0> and <1,1>, and three of those possible values include a logic "0" bit which will not satisfy the saturation condition. So, when reading and latching any of those three values with a logic "0" bit, there will be no enabling of read-increment-write operation by the saturation circuit 102 for the cells $C_{more}$ of the second sub-array 112M, and thus there is a reduction in power dissipation. Only for the <1,1> Countless value will read-increment-write operations for both the sub-arrays 112L, 112M be needed.

Figure 8:
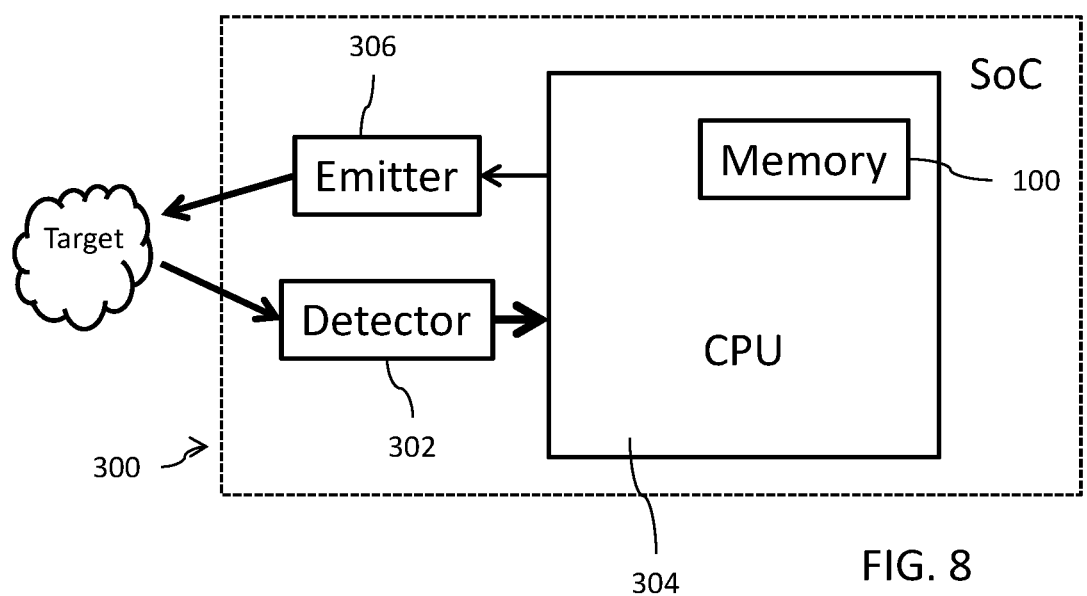
FIG. 8 shows a schematic representation of a device which utilizes the circuit of FIG. 6.

Reference is now made to FIG. 8 which shows a schematic representation of a device 300 which utilizes the circuit 100 of FIG. 6. The device 300 may, for example, comprise an image sensor in the form of a System on Chip (SoC) that includes a photosensitive circuit 302 having output that is processed by a central processing unit 304. The circuit 100 may, for example, comprise a memory which is coupled to or embedded in the central processing unit 304. In a particularly pertinent example, the image sensor may comprise a time of flight (ToF) sensor as is well known in the art. Such a sensor includes an emitter circuit 306 configured to emit light pulses which are reflected by a target back towards the photosensitive circuit 302. In response to detections of the reflected light pulses, the circuit 100 is accessed by the CPU 304 at memory addresses associated with timing measurements. Each access causes a mathematical modification (for example, increment by one) of a stored count value which over time provides histogram data useful in identifying targets and the distances to those targets.

Although the mathematical modify operation performed by data modification circuits $62_{less}$, $62_{more}$ is shown herein by example as an increment by one operation, it will be understood that the mathematical modify operation may instead be any desired operation for an application including, without limitation, an increment operation, a decrement operation or a multiply (or scaling) operation.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A memory circuit, comprising:
a memory core formed by an array of memory cells storing data words at rows, wherein said array is arranged to include a first sub-array storing less significant bits of said data words and a second sub-array storing more significant bits of said data words; wherein each row of the first sub-array is connected to a less significant word line and each row of the second sub-array is connected to a more significant word line; and
a row decoder circuit configured to receive an address, decode the received address and generate a first word line signal that is applied to a selected one of the less significant word lines for a certain data location based on the decoded address;
a first read circuit configured to read less significant bits of a data word from the first sub-array in response to the first word line signal;
a first data modification circuit configured to perform a mathematical operation on the read less significant bits in order to produce modified less significant bits that are written back to the first sub-array;
a saturation detection circuit configured to determine whether the read less significant bits are in a saturated state and in response thereto generate a second word line signal that is applied to a selected one of the more significant word lines for said certain data location based on the decoded address;
a second read circuit configured to read more significant bits of said data word from the second sub-array in response to the second word line signal; and
a second data modification circuit configured to perform a mathematical operation on the read more significant bits in order to produce modified more significant bits that are written back to the second sub-array.

2. The circuit of claim 1, wherein the mathematical operation performed by the first and second data modification circuits comprises one of an increment operation, a decrement operation or a multiply operation.

3. The circuit of claim 1, wherein the saturation detection circuit comprises a logic circuit configured to logically combine the read less significant bits.

4. The circuit of claim 3, wherein the logic circuit is a logical AND gate.

5. The circuit of claim 1, wherein each of the first and second data modification circuits comprises an adder circuit configured to perform the mathematical operation.

6. The circuit of claim 1, wherein performance of the mathematical operation by the first and second data modification circuits and writing of the modified less significant bits and modified more significant bits back to the first sub-array and second sub-array, respectively, is completed within a single clock cycle of a clock applied to the memory circuit.

7. The circuit of claim 6, wherein said generation of the first word line signal occurs in response to a pulse of said clock.

8. The circuit of claim 1, wherein generation of the second word line signal by the saturation detection circuit is inhibited if the read less significant bits are determined to not be in a saturated state.

9. The circuit of claim 1, wherein memory cells of the first sub-array have a higher read current than memory cells of the second sub-array.

10. The circuit of claim 1, where each data word is a count value for a histogram.

11. An image sensor, comprising:
an emitter circuit;
a detector circuit; and
a processing circuit coupled to the emitter circuit and detector circuit, wherein said processing circuit includes a memory circuit of claim 1.

12. The image sensor of claim 11, wherein the image sensor is a time of flight sensor and the data words are count values which histogram data for target identification and distance.

13. A method for operating a memory circuit that includes an array of memory cells storing data words at rows, wherein said array is arranged to include a first sub-array storing less significant bits of said data words and a second sub-array storing more significant bits of said data words, and wherein each row of the first sub-array is connected to a less significant word line and each row of the second sub-array is connected to a more significant word line, the method comprising:
  applying a first word line signal to a selected one of the less significant word lines for a certain data location to read less significant bits of a data word from the first sub-array;
  first performing a mathematical operation on the read less significant bits in order to produce modified less significant bits;
  writing the modified less significant bits back to the first sub-array;
  determining whether the read less significant bits are in a saturated state and if so then applying a second word line signal to a selected one of the more significant word lines for said certain data location to read more significant bits of said data word from the second sub-array;
  second performing a mathematical operation on the read more significant bits in order to produce modified more significant bits; and
  writing the modified more significant bits back to the second sub-array.

14. The method of claim 13, wherein the mathematical operation comprises one of an increment operation, a decrement operation or a multiply operation.

15. The method of claim 13, wherein determining whether the read less significant bits are in a saturated state comprises logically combining the read less significant bits.

16. The method of claim 15, wherein logically combining comprises logically ANDing.

17. The method of claim 13, wherein applying, first performing, writing the modified less significant bits, determining, second performing and writing the modified more significant bits are completed within a single clock cycle of a clock for the memory circuit.

18. The method of claim 17, wherein applying occurs in response to a pulse of said clock.

19. The method of claim 13, wherein applying the second word line signal is inhibited if the read less significant bits are determined to not be in a saturated state.

20. The method of claim 13, wherein reading the less significant bits of the data word from the first sub-array comprises generating a first read current from each cell of the first sub-array, and wherein reading the more significant bits of the data word from the second sub-array comprises generating a second read current from each cell of the second sub-array, and wherein the first current is greater than the second current.

21. The method of claim 13, where each data word is a count value for a histogram.

* * * * *